United States Patent van de Water et al.

[15] 3,646,409

[45] Feb. 29, 1972

[54] HEAT-SINKING PACKAGE FOR SEMICONDUCTOR INTEGRATED CIRCUIT

[72] Inventors: Johannes Theodorus van de Water; Joannes Joseph Van Hout; Arie Baelde, all of Nijmegen, Netherlands

[73] Assignee: U.S. Philips Corporation, New York, N.Y.

[22] Filed: July 29, 1969

[21] Appl. No.: 845,921

[30] Foreign Application Priority Data

July 30, 1968 Netherlands..........................6810761

[52] U.S. Cl.....................317/234 R, 317/234 A, 317/234 E, 317/234 G, 317/234 N, 174/52 PE

[51] Int. Cl.........................................H01l 3/00, H01l 5/00

[58] Field of Search............................317/234, 235; 174/52

[56] References Cited

UNITED STATES PATENTS

| | | | |
|---|---|---|---|
| 3,290,564 | 12/1966 | Wolff | 317/234 |
| 3,496,427 | 2/1970 | Lee | 317/234 |
| 3,509,430 | 4/1970 | Mroz | 317/234 |
| 3,447,042 | 5/1969 | Andersson | 317/234 |
| 3,492,547 | 1/1970 | Recko et al. | 317/234 |

OTHER PUBLICATIONS

Monolithic Chip Carrier; by Betz et al., IBM Technical Bulletin Vol. 9, No. 11, Apr. 1967

Package Technique; by Silver et al.; IBM Technical Bulletin Vol. 9, No. 11, Apr. 1967

Circuit Package; by Miller et al.; IBM Technical Bulletin Vol. 9, No. 12, May 1968

*Primary Examiner*—John W. Huckert
*Assistant Examiner*—Andrew J. James
*Attorney*—Frank R. Trifari

[57] ABSTRACT

A package to improve heat dissipation of a semiconductor integrated circuit is described. The semiconductor crystal is mounted on one conductor of a lead frame, to which is joined a cooling block, and then the assembly encapsulated in a resin envelope, such that the whole block, except for the side joined to the conductor, lies outside the plane of the conductors. In this way, adequate heat dissipation is ensured via the block rather than the lead conductors themselves. If desired, this first package can then be encapsulated in a second resin envelope containing a second conductor set and a second cooler in the form of a plate.

5 Claims, 13 Drawing Figures

Figure 1:
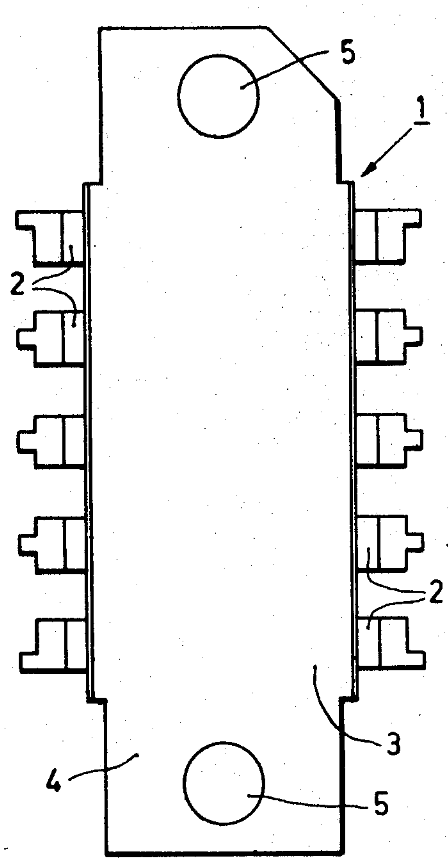

INVENTORS
JOHANNES TH. VAN DE WATER
JOANNES J. VAN HOUT
ARIE BAELDE
BY
Frank R. Trifari
AGENT INVENTORS
JOHANNES TH. VAN DE WATER
JOANNES J. VAN HOUT
ARIE BAELDE
BY
Frank R. Trifari
AGENT INVENTORS
JOHANNES TH. VAN DE WATER
JOANNES J. VAN HOUT
ARIE BAELDE
BY
Frank R. Trifari
AGENT INVENTORS
JOHANNES TH VAN DE WATER
JOANNES J. VAN HOUT
ARIE BAELDE
BY
Frank R. Trifari
AGENT

HEAT-SINKING PACKAGE FOR SEMICONDUCTOR INTEGRATED CIRCUIT

The invention relates to a semiconductor device comprising conductors formed from metal strips, a crystal provided on one of the conductors which comprises an integrated circuit, electrically conductive connections from the crystal to the conductors, and an insulating envelope of a synthetic material in which the integrated circuit, the conductive connections and a part of the conductors are accommodated, the enveloped conductors being situated substantially in one plane.

The heat dissipation of the crystal which comprises the integrated circuit, has so far been effected through the conductor on which the crystal is connected. In order to obtain a somewhat considerable heat dissipation, said conductor is wide, while it, and necessarily also the other conductors which are normally formed from a metal strip as a so-called grid, must be comparatively thick. The process of obtaining the grid of conductors from a thick metal strip is more difficult than from a thin strip which increases the cost-price for the known semiconductor device. Furthermore limits are imposed upon the thickness of the ends of the conductors, since said ends must generally be suitable for being inserted into small apertures of a mounting panel. Therefore such a construction may be less suitable for producing a sufficient heat dissipation of the crystal, particularly when an integrated circuit for a comparatively large electric power is used in which a large quantity of thermal energy is dissipated.

It is the object of the invention to provide a semiconductor device in which the problem of the dissipation of the heat produced in the crystal is solved in a simple and efficacious manner. In order to achieve this, the semiconductor device according to the invention comprises a cooling element which is secured, opposite to the crystal, to the conductor supporting the crystal, the further part of the cooling element extending outside the plane in which the conductors are situated. In this manner a sufficient heat dissipation via the cooling element is always obtainable. Since the dissipation of heat is not carried out through conductors, the conductors need not be given an unfavorable shape.

In one embodiment of the invention, the cooling element consists of a block of heat-conducting material to which a plate of a heat-conducting material is connected. The cooling element constructed in this manner can be manufactured in a simple manner and with simple means. According to the invention, the cooling element preferably consists of a block of copper which is soldered to the conductor supporting the crystal, the plate being manufactured from aluminum which is secured to the copper block by means of a heat-conducting glue.

In a further embodiment according to the invention, the crystal is secured to a conductor which forms part of a first set of conductors, a block of heat-conducting material being provided on the conductor which supports the crystal, said first set of conductors with crystal and block being accommodated in a first envelope of synthetic material in such manner that the outside of the block is situated on one outer side of the envelope, the connections of the first set of conductors being secured to a second set of strip-shaped conductors, the first envelope and a part of the second set of conductors being accommodated in a second envelope of synthetic material. This construction is suitable for integrated circuits of relatively small power. In case of a large power, according to the invention a heat-conducting plate may be secured to the outer surface of the block housed in the first envelope which plate is at least partly incorporated in the second envelope of synthetic material. Such a semiconductor device has proven very favorable in experiments.

In another embodiment according to the invention the plate is shaped so that its outer surface coincides substantially with another surface of the second envelope. Such a semiconductor device enables a comparatively large heat dissipation. The plate may coincide entirely with the outer surface or be situated partly below it at a small distance.

If the heat dissipation is to be increased, according to the invention, the ends of the heat-conducting plate may project from the envelope.

A very strong heat dissipation is obtained if, according to the invention, the ends of the plate projecting from the envelope comprise a hole to secure the strip to a cooling member.

In another embodiment the crystal is secured to a conductor which forms part of one single grid of conductors used, a cooling plate having a deformed part being secured to the rear side of the conductor supporting the crystal, a part of the conductors, the crystal and at least a part of the cooling plate being accommodated in an envelope of synthetic material.

Figure 2:
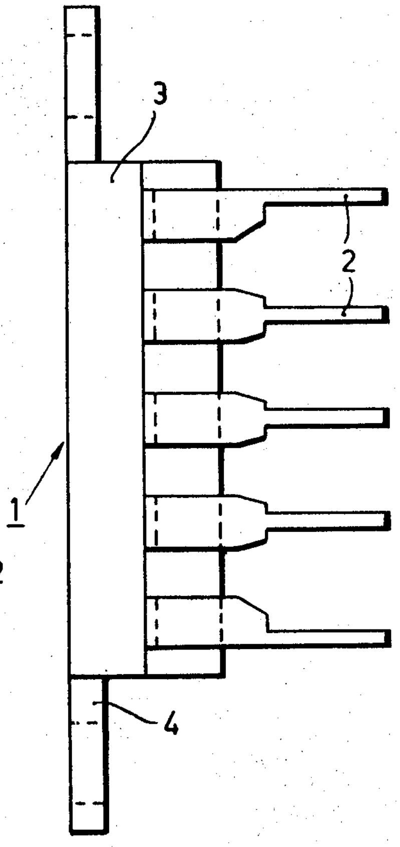
Figure 3:
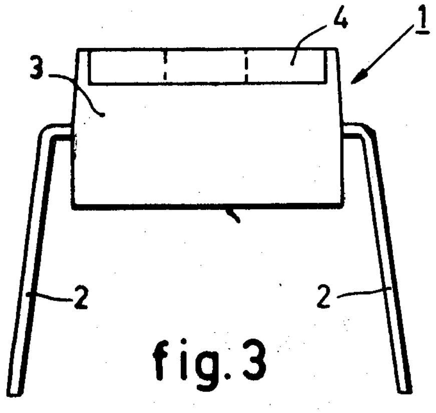
Figure 4:
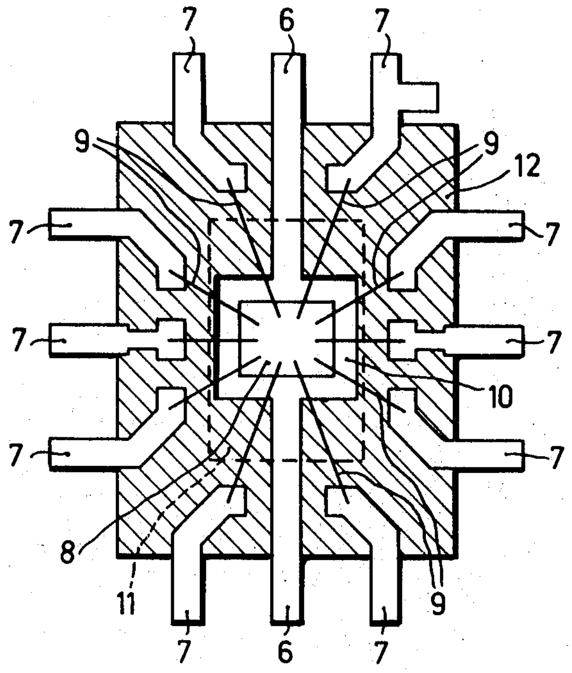
Figure 5:
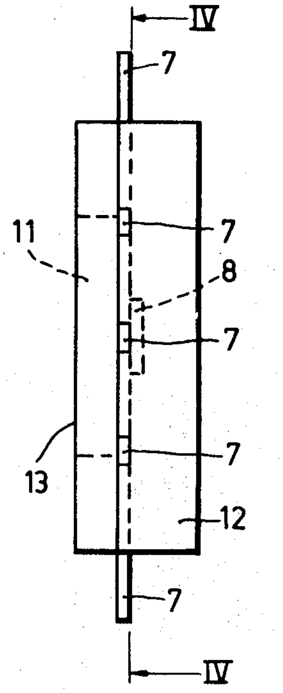
Figure 6:
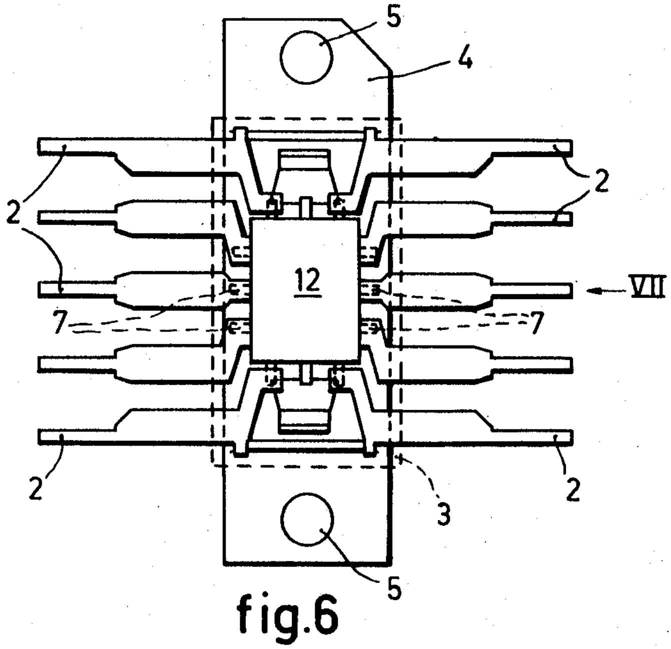
Figure 7:
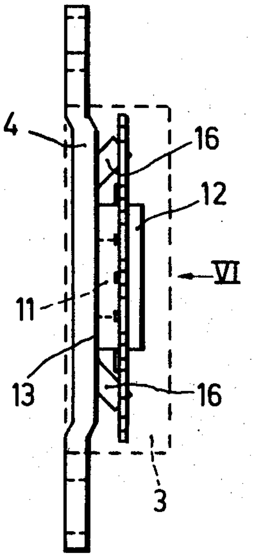
Figure 8:
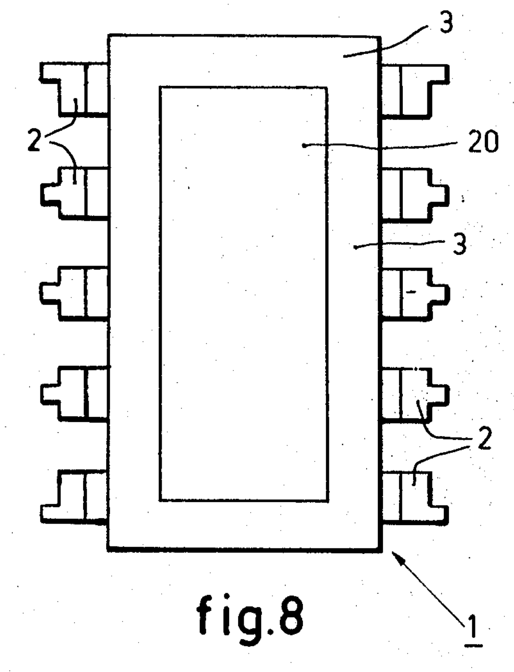
Figure 9:
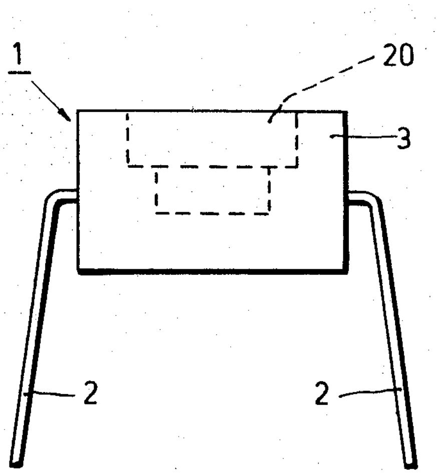
Figure 10:
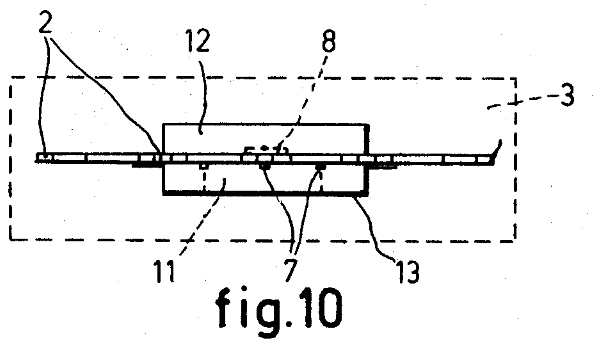
Figure 11:
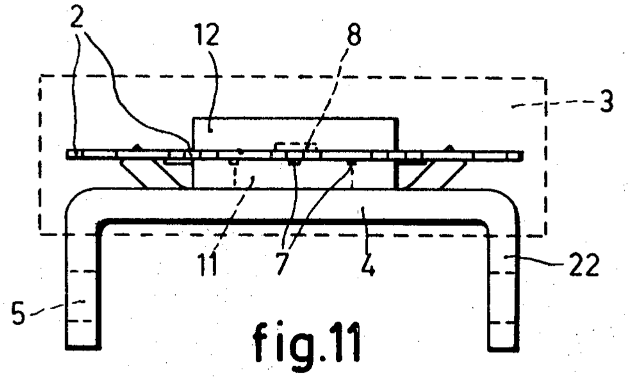
Figure 12:
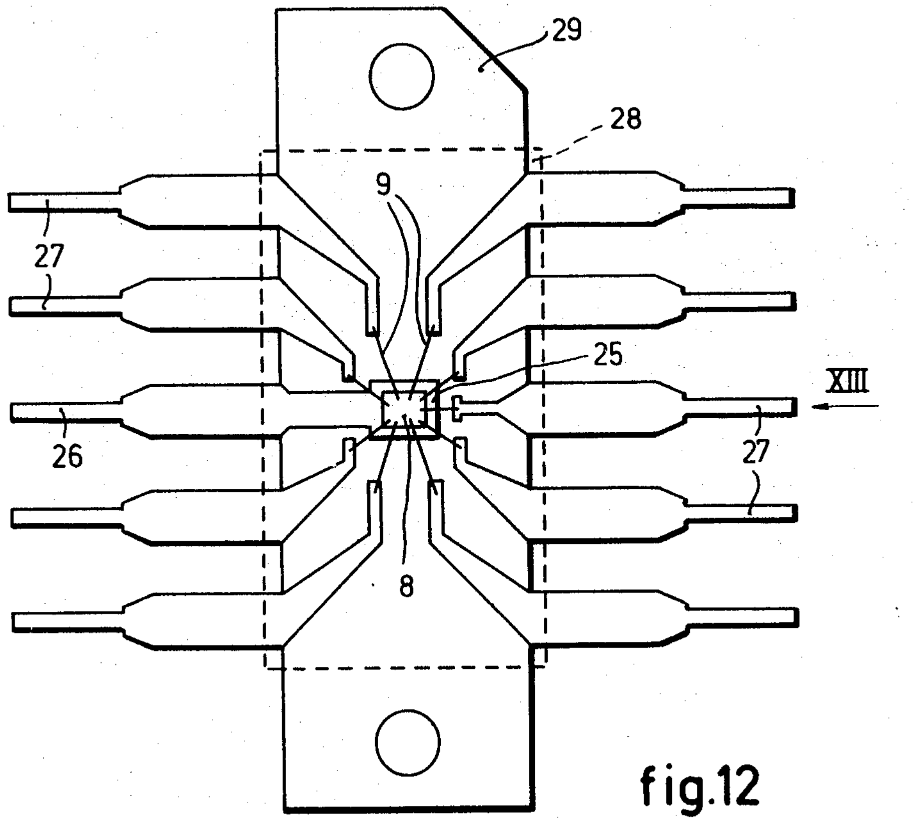
Figure 13:
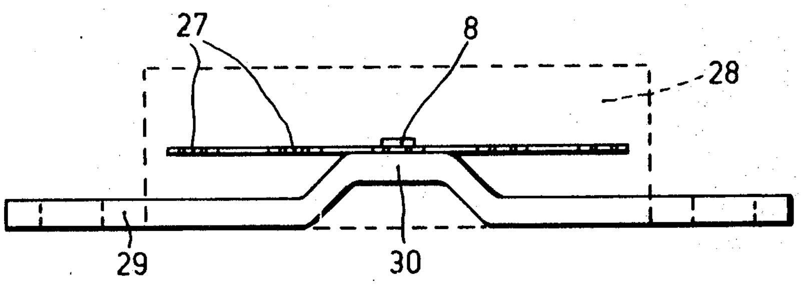

In order that the invention may be readily carried into effect, a few examples thereof will now be described in greater detail, by way of example, with reference to the accompanying drawings, in which FIGS. 1, 2 and 3 are a plan view and two side elevations, respectively of a first embodiment of the semiconductor device, FIG. 4 is a cross-sectional view taken on the line IV—IV in FIG. 5, and FIG. 5 is an elevation of a subassembly consisting of conductors, crystals and heat-conducting blocks, the subassembly being enveloped with synthetic material, FIGS. 6 and 7 are a plan view and a side-elevation, respectively, of a second set of conductors and a cooling plate to which the subassembly shown in FIGS. 4 and 5 is secured, FIGS. 8 and 9 are a plan view and a side view, respectively, of a second embodiment of the semiconductor device, FIG. 10 is an elevation of another embodiment, FIG. 11 is an elevation of a further embodiment, FIG. 12 is a plan view and FIG. 13 a side elevation of a semiconductor device in which the cooling element is constructed in still a different manner.

FIGS. 1, 2 and 3 show a semiconductor device which comprises an integrated circuit. In the embodiment shown said semiconductor device comprises ten electric conductors 2. The envelope 3 consists of an insulating synthetic material.

Furthermore a cooling plate 4 comprising two holes 5 is visible which is embedded in the envelope of synthetic material. A semiconductor device in which the conductors 2 are bent and are situated in two rows is generally referred to as dual-in-line.

FIGS. 4 and 5 show a subassembly, a part of the semiconductor device shown in FIGS. 1 to 3 to be manufactured separatively. This subassembly comprises flat metal conductors 6 and 7 which are etched, for example, from a strip of Fernico which is 0.1 mm. thick. These conductors which show a mutual coherence, are referred to as a grid. The conductors 6 comprise a widened part 10 on which a crystal 8 is secured. This crystal may consist, for example, of a plate of silicon in which an integrated circuit is provided in a manner known to those skilled in the art. The crystal may be secured, for example, by means of a gold-silicon compound, to the widened part 10 of the conductors 6. The contact places of the integrated circuit are connected to conductors 7 by means of wires 9, for example, of gold or aluminum. On the side of the widened part 10 remote from the crystal a copper block 11 is soldered, for example, by means of a lead-tin solder. The conductors 6, 7, the crystal 8 and the copper block 11 are incorporated in an insulating envelope 12 of a synthetic material, the outside of the copper block just coinciding with the outer surface 13 of said envelope 12.

FIGS. 6 and 7 show the ultimate shape of the semiconductor device shown in FIGS. 1 to 3, in which the envelope 3 of synthetic material is shown in broken lines and the conductors 2 are not bent. The conductors may again be formed as a coherent part, the so-called grid, from a strip of Fernico, 0.25 mm. thick. On the inwardly directed ends of the conductors 2, the ends of the conductors 7 projecting from the envelope 12 of synthetic material are secured. On the side 13 of the envelope 12 where the copper block 11 emerges at the surface of the envelope, an aluminum plate 4 is secured to the block 11 by means of a heat-conducting glue (not shown). The conducting glue may consist, for example, of an epoxy resin containing finely divided silver. Two lugs 16 are punched in the aluminum plate 4 so as to obtain a good embedding of the plate 4 in the envelope 3 of synthetic material.

In the embodiment of the semiconductor device described it has become possible in a simple manner to obtain a very ready dissipation of the heat evolved in the crystal. This is mainly due to the fact that the heat dissipation need not be carried out through the conductors 6. By means of the separate cooling element, which extends mainly beyond the plane in which the electrical conductors are situated, an extremely suitable heat dissipation is ensured. The embodiment shown is of particular importance for cooling a crystal comprising an integrated circuit for a comparatively large electric power. The cooling of the crystal can become optimum if a plate of molybdenum is provided between the crystal and the Fernico conductor 6. The cooling plate may be secured, for example, by means of bolts which are threaded through the holes 5, to a body having a large cooling area or to a heat conducting strip. The copper block 11 is situated immediately against the lower side of the crystal which is favorable for a good and rapid heat transport.

FIGS. 8 and 9 show a semiconductor device which is constructed substantially in the same manner as the semiconductor device described with reference to FIGS. 1 to 7. The cooling plate is denoted by reference numeral 20 in these Figures. The cooling plate 20 in this embodiment does not project beyond the envelope 3. Since the outer surface of the cooling plate 20 coincides substantially with an outer surface of the envelope 3, a rather strong heat dissipation is ensured in this embodiment also, although it is slightly smaller than in the construction shown in FIGS. 1 to 3. The semiconductor device shown in FIGS. 8 and 9, which in appearance is not distinguished from a semiconductor device in which no particular measures were taken to cool the crystal, therefore is preferably suitable for being used in integrated circuits for not too large an electric power. If the requirements to be imposed upon the heat dissipation are comparatively small, it may be sufficient to use only the copper block 11 (see FIG. 10) in which case the aluminum strips may be omitted. It will furthermore be obvious that the aluminum cooling plate need not be situated substantially parallel to the conductors but that, for example, a cooling plate 22 having a shape as is shown in FIG. 11 may also be used. Furthermore, any desirable readily heat-conducting material may be chosen both for the block 11 and for the cooling plate.

It is not necessary for the cooling element to consist of two parts, namely the block 11 and the plate 14, 20, or 22. With the same heat-conducting effect, the plate may consist of one unit, for example, of an aluminum strip or a copper strip, which is secured by means of a conducting epoxy resin or a solder to the rear side of the conductor supporting the crystal, the remaining part of said strip being situated outside the plane of the conductors. FIGS. 12 and 13 show an example hereof. In this example, the subassembly with a separate envelope of synthetic material as shown in FIGS. 4 and 5 is not used, but the crystal 8 is directly placed on a widened portion 25 of a conductor 26. The conductor 26 forms part of a grid of conductors manufactured from a metal strip, for example, Fernico, the ends of the conductors 27 projecting beyond the ultimate envelope 28 of synthetic material. The contact places of the crystal 8 are directly connected to the conductors 27, for example, by means of gold or aluminum wires 9. The shape of the cooling element 29 which is very suitable for this construction is shown most clearly in FIG. 13. The cooling element 29 in this case consists of an aluminum strip which is situated substantially parallel to the plane of the conductors 26, 27, but which shows a deformed part 30 which is secured to the widened portion 25 of the conductor 26.

In the construction shown the aluminum strip 29 projects from the envelope 28. However, this is by no means necessary when the heat to be dissipated from the crystal has not too large a value. In this case, the shapes as shown in FIGS. 8 to 10, for example, may also be used. In the construction shown in FIGS. 12 and 13 it is alternatively possibly to use the combination of copper block and aluminum plate as a cooling element. Since, however, no subassembly is used in this case, the use of a separate copper block generally is not necessary.

What is claimed is:

1. A semiconductor device comprising a semiconductor crystal containing an integrated circuit, a first set of striplike electrical conductors having portions situated substantially in one plane, means for electrically connecting some of the first set of conductors to points of the integrated circuit on the crystal, means joining the crystal in an electrically conductive manner to another of the conductors as a support therefor, a first solid cooling element, means joining the cooling element on one of its sides to said other conductor on the side thereof opposite to the side joined to the crystal, a first insulating envelope of synthetic material encapsulating the crystal, the connecting means, and a part of the conductors adjacent the connecting means and including the portions thereof situated substantially in said one plane, all of the cooling element except for the side joined to said other conductor extending outside said one plane in which the conductor portions are situated, a second set of striplike electrical conductors, means connecting ends of the first conductor set remote from the crystal to adjacent ends of the second conductor set, and a second insulating envelope of synthetic material encapsulating the first envelope, the first conductor set, and the part of the second conductor set adjacent thereto.

2. A semiconductor device as claimed in claim 1 wherein another side of the first cooling element is situated on the outside of the first insulating envelope, a second heat-conducting plate is connected to the outer other side of the first cooling element, and the second plate is incorporated at least partly in the second envelope of synthetic material.

3. A semiconductor device as claimed in claim 2 wherein the second plate is constructed so that its outer surface coincides substantially with an outer surface of the second envelope.

4. A semiconductor device as claimed in claim 2 wherein the ends of the second heat-conducting plate project from the second envelope.

5. A semiconductor device as claimed in claim 4 wherein the ends of the second plate projecting from the envelope include a mounting hole for mounting to a heat sink.

* * * * *